United States Patent
Gong et al.

(10) Patent No.: US 11,903,164 B2
(45) Date of Patent: Feb. 13, 2024

(54) HEAT DISSIPATION APPARATUS, DEVICE, RACK, AND SYSTEM

(71) Applicant: HUAWEI TECHNOLOGIES CO., LTD., Shenzhen (CN)

(72) Inventors: Xinhu Gong, Shenzhen (CN); Gaoliang Xia, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 47 days.

(21) Appl. No.: 17/552,722

(22) Filed: Dec. 16, 2021

(65) Prior Publication Data

US 2022/0110224 A1    Apr. 7, 2022

Related U.S. Application Data

(63) Continuation of application No. PCT/CN2019/103899, filed on Aug. 31, 2019.

(51) Int. Cl.
*H05K 7/20* (2006.01)
*H01L 23/473* (2006.01)

(52) U.S. Cl.
CPC ....... *H05K 7/20254* (2013.01); *H01L 23/473* (2013.01); *H05K 7/20272* (2013.01)

(58) Field of Classification Search
CPC ........... H05K 7/20254; H05K 7/20627; H05K 7/20272; H05K 7/20636; H05K 7/20763; H05K 7/20772; H05K 7/20872; H05K 7/20927; H01L 23/473
See application file for complete search history.

(56) References Cited

U.S. PATENT DOCUMENTS

| 5,016,090 | A | * | 5/1991 | Galyon | H01L 23/4336 257/714 |
| 7,413,402 | B2 | * | 8/2008 | Kang | H05K 7/20172 415/213.1 |
| 7,733,654 | B2 | | 6/2010 | Wang et al. | |
| 10,415,597 | B2 | * | 9/2019 | Lyon | F04D 13/0673 |

(Continued)

FOREIGN PATENT DOCUMENTS

| CN | 201715908 U | 1/2011 |
| CN | 103398613 A | 11/2013 |

(Continued)

*Primary Examiner* — Zachary Pape
(74) *Attorney, Agent, or Firm* — Maier & Maier, PLLC

(57) ABSTRACT

A heat dissipation apparatus includes a heat-conducting plate, where a liquid channel is disposed on a first surface of the heat-conducting plate; a mounting base, where an accommodation cavity configured to accommodate a partial area that is in the heat-conducting plate and that includes a second surface is disposed on the mounting base. The first surface and the second surface are disposed opposite to each other. A pressing plate is configured to fasten the heat-conducting plate in the accommodation cavity. The pressing plate is detachably and firmly connected to the mounting base, a sealing cavity is formed between the pressing plate and the first surface of the heat-conducting plate, and the sealing cavity is configured to accommodate the liquid channel A liquid inlet connector and a liquid outlet connector that are connected to the liquid channel are disposed on the pressing plate.

19 Claims, 12 Drawing Sheets

(56) References Cited

U.S. PATENT DOCUMENTS

| | | | | |
|---|---|---|---|---|
| 10,816,279 B2* | 10/2020 | Huang | ................... | F28F 3/10 |
| 2008/0314559 A1* | 12/2008 | Hsu | ................... | F28D 9/0037 |
| | | | | 165/80.4 |
| 2009/0147454 A1 | 6/2009 | Wang et al. | | |
| 2022/0142016 A1* | 5/2022 | Gradinger | .......... | H05K 7/20927 |
| | | | | 361/699 |
| 2022/0210949 A1* | 6/2022 | Edmunds | ........... | H05K 7/20272 |
| 2022/0341431 A1* | 10/2022 | Tivadar | ................ | F28D 7/1684 |

FOREIGN PATENT DOCUMENTS

| | | | |
|---|---|---|---|
| CN | 103702549 | A | 4/2014 |
| CN | 106470537 | A | 3/2017 |
| CN | 109121355 | A | 1/2019 |
| CN | 110035642 | A | 7/2019 |
| CN | 110035643 | A | 7/2019 |

* cited by examiner

HEAT DISSIPATION APPARATUS, DEVICE, RACK, AND SYSTEM

CROSS-REFERENCE TO RELATED APPLICATIONS

This application is a continuation of International Patent Application No. PCT/CN2019/103899, filed on Aug. 31, 2019, the disclosure of which is hereby incorporated by reference in its entirety.

TECHNICAL FIELD

The embodiments relate to the field of heat dissipation technologies, and in particular, to a heat dissipation apparatus, a device, a rack, and a system.

BACKGROUND

With rapid development of the information technology (IT) field, a computing speed of a chip in a device (for example, a server and a storage device) is becoming faster. However, as a processing capability of the chip is improved, heat generated by the chip also increases. For a conventional device, heat is usually dissipated for the chip in a liquid cooling heat dissipation manner. In the liquid cooling heat dissipation manner, a liquid cooling heat dissipation apparatus needs to be installed on the chip, and heat is dissipated from the chip by circulating liquid inside the heat dissipation apparatus. When the liquid heat dissipation apparatus is assembled, the liquid heat dissipation apparatus usually uses an integrated structure and is fastened to the chip by using a floating screw. However, when the heat dissipation apparatus with the integrated structure is used to perform heat dissipation for chips with different specifications, the apparatus needs to be correspondingly adapted according to a specification of each chip. In addition, a component layout in a device in which the chip is located needs to be considered.

SUMMARY

The embodiments provide a device, a rack, and a system to improve adaptability of the heat dissipation apparatus.

According to a first aspect, the embodiments provide a heat dissipation apparatus. The heat dissipation apparatus is configured to dissipate heat for a chip. The heat dissipation apparatus uses a separated structure and comprises a heat-conducting plate, a mounting base, and a pressing plate. The mounting base, the heat-conducting plate, and the pressing plate are disposed in a sandwich laminated manner, and the heat-conducting plate is located between the mounting base and the pressing plate. The heat-conducting plate includes a first surface and a second surface that are disposed opposite to each other, the mounting base is configured to bear the heat-conducting plate, and an accommodation cavity configured to accommodate a partial area that is in the heat-conducting plate and that includes the second surface is disposed on the mounting base. The heat-conducting plate is used as a main structure of the heat dissipation apparatus, and a liquid channel is disposed on the first surface of the heat-conducting plate and is configured for liquid flowing. The pressing plate is configured to fasten the heat-conducting plate into the accommodation cavity of the mounting base. The pressing plate is detachably connected to the mounting base, a sealing cavity is formed between the pressing plate and the first surface of the heat-conducting plate, and the sealing cavity is configured to accommodate the liquid channel. In addition, a liquid inlet connector and a liquid outlet connector that are connected to the liquid channel are disposed on the pressing plate. During use, the liquid inlet connector and outlet connector are separately connected to an external pipe. Liquid flows into the liquid channel through the liquid inlet connector to dissipate heat for the chip, and then flows out of the external pipe through the liquid outlet connector to form a circulation. In the foregoing structure, the entire heat dissipation apparatus uses a modularized standard separated structure, and the pressing plate and the mounting base may be made into standard parts. When heat dissipation is performed on chips having different heat dissipation requirements, only a corresponding heat-conducting plate needs to be selected as required, and the mounting base and the pressing plate may still be used. Compared with an integral liquid heat dissipation apparatus, the heat dissipation apparatus eliminates the need to select different liquid heat dissipation apparatuses for different chips, enhances universality, and improves adaptability of the heat dissipation apparatus. In addition, a modularized standard is used to reduce production difficulty of the heat dissipation apparatus and make a manufacturing process easier.

In a possible implementation, the heat-conducting plate includes a substrate configured to be clamped into the accommodation cavity, and a heat dissipation structure firmly disposed on the substrate, and the heat dissipation structure is the liquid channel. The substrate and an accommodating groove are relatively fastened through fitting between the substrate and the accommodating groove.

In another possible implementation, an accommodation groove that accommodates the heat dissipation structure is disposed on the pressing plate. The liquid channel is covered by the accommodation groove and the liquid channel is sealed.

In another possible implementation, the heat dissipation structure may be a pipe, a groove, or a capillary structure. In other words, different structures may be used to form the liquid channel.

In another possible implementation, the pressing plate is sealed with and connected to the substrate by using a sealing gasket. The sealing gasket is used to seal the pressing plate and the liquid channel.

In another possible implementation, a placement groove is disposed on the substrate, and the sealing gasket is disposed in the placement groove.

In another possible implementation, a first position-limiting protrusion is disposed in the accommodation cavity of the mounting base, and a second position-limiting protrusion clamped with the first position-limiting protrusion is disposed on the substrate. The pressing plate can tightly press the heat-conducting plate onto the mounting base through fitting between the first position-limiting protrusion and the second position-limiting protrusion. The mounting base uses a frame-shaped hollow structure, so that the heat-conducting plate can be directly connected to the chip by using a heat-conducting adhesive or another heat-conducting medium. This improves a heat transfer effect of the heat-conducting plate for the chip.

In another possible implementation, a third position-limiting protrusion is disposed on the substrate, and the third position-limiting protrusion abuts against a surface of the mounting base. The pressing plate can tightly press the heat-conducting plate onto the mounting base through fitting between the third position-limiting protrusion and the mounting base.

In another possible implementation, the heat dissipation apparatus further includes a pressing cover, where the pressing cover is detachably and firmly connected to the mounting base, and the pressing cover is pressed onto the heat-conducting plate.

In another possible implementation, stiffness of the pressing cover is greater than stiffness of the pressing plate. The liquid channel between the pressing plate and the heat-conducting plate may further be fastened by using the pressing cover, to prevent the liquid from flowing out of the heat dissipation apparatus. In addition, when the liquid in the liquid channel flows too fast, the pressing plate needs to bear relatively large acting force, which easily causes expansion of the pressing plate. A reinforcement structure of the pressing cover may also assist the pressing cover in bearing a part of the acting force, to avoid problems such as expansion of the pressing plate and liquid leakage.

In another possible implementation, at least one of the liquid inlet connector and the liquid outlet connector is rotationally connected to the pressing plate. When the liquid inlet connector or the liquid outlet connector is rotationally disposed, a connection direction of the liquid inlet connector or the liquid outlet connector may be adjusted, so that a position of the liquid inlet connector or the liquid outlet connector connected to the external pipe may be adjusted according to an implementation requirement. This reduces a space requirement of a heat sink and improves adaptability of the heat sink.

In another possible implementation, both the liquid inlet connector and the liquid outlet connector are firmly connected to the pressing plate.

In another possible implementation, both the liquid inlet connector and the liquid outlet connector are an inverted L-shaped connector.

In another possible implementation, the liquid inlet connector and the liquid outlet connector are separately connected to the pressing plate by using a sealing ring, to ensure connection sealing.

In another possible implementation, the pressing cover tightly presses the liquid outlet connector and the liquid inlet connector onto the pressing plate. Positions of the liquid outlet connector and the liquid inlet connector are limited by using the pressing cover.

In another possible implementation, bosses that are in a one-to-one correspondence with the liquid inlet connector and the liquid outlet connector are disposed on the pressing plate, each boss has a mounting groove, the liquid inlet connector or the liquid outlet connector has a convex shoulder assembled in the mounting groove, and the pressing cover tightly presses the convex shoulder into the mounting groove.

In another possible implementation, when the pressing cover does not tightly press the convex shoulder into the mounting groove, the convex shoulder may rotate relative to the mounting groove.

In another possible implementation, a side wall of the mounting groove has a plurality of position-limiting protrusions, and the convex shoulder has a position-limiting groove fitting with each position-limiting protrusion; or a side wall of the mounting groove has a plurality of position-limiting grooves, and the convex shoulder has a position-limiting protrusion fitting with each position-limiting groove.

In another possible implementation, the pressing plate is a rectangle, and the liquid inlet connector and the liquid outlet connector are disposed in a diagonal manner. Certainly, the liquid inlet connector and the liquid outlet connector may alternatively be located on a same side of the pressing plate.

In another possible implementation, a floating screw configured to connect to the chip is disposed on the mounting base, to ensure sufficient pressure when the mounting base is connected to the chip.

In another possible implementation, the second surface of the heat-conducting plate is at least greater than or equal to a surface area of a to-be-heat-dissipated chip, and the second surface is a surface that is of the chip and that is used to connect to the heat-conducting plate in a heat-conducting manner.

In another possible implementation, the sealing cavity is filled with liquid, and the liquid flows in the liquid channel.

In another possible implementation, the heat dissipation apparatus is configured to connect to a cooling system, cold liquid in the cooling system enters the sealing cavity of the heat dissipation apparatus, heat generated by the chip is transferred to the liquid by using the heat-conducting plate, a temperature of the liquid increases after absorbing the heat, and the high-temperature liquid flows back to the cooling system for cooling.

According to a second aspect, a device is provided. The device includes a mainboard, a chip disposed on the mainboard, and the heat dissipation apparatus that is firmly connected to the mainboard and that is used to dissipate heat for the chip. In the foregoing structure, the entire heat dissipation apparatus uses a modularized standard separated structure, and the pressing plate and the mounting base may be made into standard parts. When heat dissipation is performed on chips having different heat dissipation requirements, only a corresponding heat-conducting plate needs to be selected as required, and the mounting base and the pressing plate may still be used. Compared with the prior art in which different liquid heat dissipation apparatuses need to be selected for different chips in an integral liquid heat dissipation apparatus, the implementation may improve adaptability of the heat dissipation apparatus. In addition, a modularized standard is used to reduce production difficulty of the heat dissipation apparatus and facilitates processing.

In a possible implementation, a cooling system is further included. The cooling system includes a liquid inlet pipe and a liquid outlet pipe. The liquid inlet pipe is sealed with and connected to a liquid inlet connector, and the liquid outlet pipe is sealed with and connected to a liquid outlet connector. A circulation loop is formed to dissipate heat for the chip through fitting between the cooling system and the heat dissipation apparatus.

According to a third aspect, a rack is provided. The rack includes the foregoing heat dissipation apparatus or the foregoing device.

According to a fourth aspect, a system is provided. The system includes the heat dissipation apparatus and the cooling system according to possible implementations of the first aspect. The cooling system includes a power apparatus configured to enable liquid to flow in a liquid channel in the heat dissipation apparatus and a cooling apparatus configured to cool liquid in the heat dissipation apparatus.

The implementations provided in the foregoing aspects may further be combined to provide more implementations.

DETAILED DESCRIPTION OF THE EMBODIMENTS

For ease of understanding, an implementation of a heat dissipation apparatus is first described.

The heat dissipation apparatus may be configured to dissipate heat for a chip in a device. The device may be a server, a storage device, a router, a switch, or the like. The storage device includes a data storage device such as a storage array or a backup device.

Figure 1:
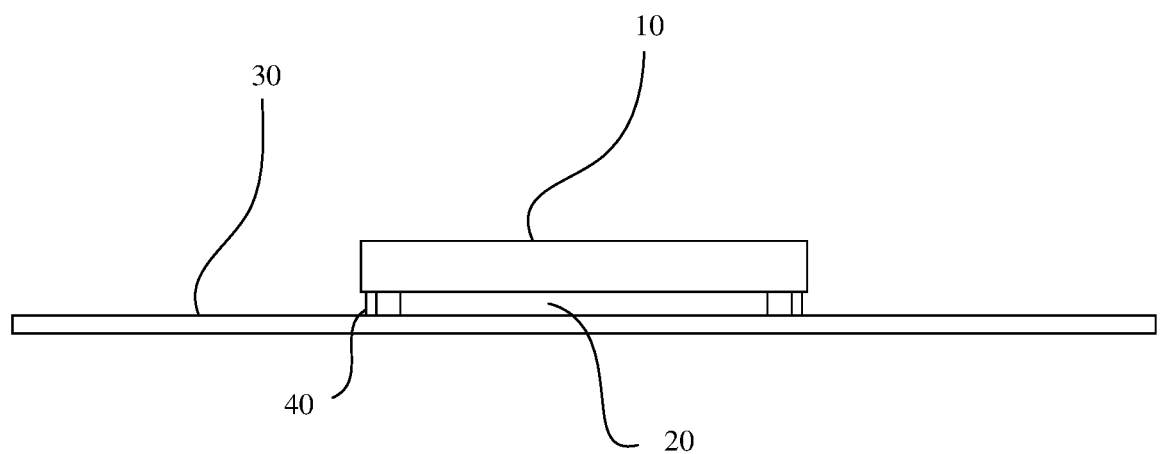
FIG. 1 is a schematic structural diagram of a device.

FIG. 1 is a schematic structural diagram of a device. As shown in the figure, the device includes a heat dissipation apparatus 10, a chip 20, a mainboard 30, and a connecting piece 40. In an assembly process of the device, the chip 20 may be configured to the mainboard 30 (which may also be referred to as a printed circuit board (PCB) of the device. The heat dissipation apparatus 10 is firmly connected to the mainboard 30 that bears the chip 20 by using the connecting piece 40, and the fastened connection is detachable. It should be understood that the mainboard 30 bearing the chip 20 is merely an example, and the chip 20 may alternatively be configured to another part of the device.

The heat dissipation apparatus 10 may dissipate heat for the chip 20. An area of an effective heat dissipation surface of the heat dissipation apparatus 10 may be greater than or equal to an area of a surface on which a to-be-heat-dissipated chip is in contact with the heat dissipation apparatus 10, to ensure effective heat dissipation for the to-be-heat-dissipated chip. The effective heat dissipation surface of the heat dissipation apparatus 10 is an area of a surface that is in the heat dissipation apparatus 10 and that is used to connect to the to-be-heat-dissipated chip. The part is used to conduct heat generated by the to-be-heat-dissipated chip to the heat dissipation apparatus 10, and then the heat dissipation apparatus 10 conducts the heat to the outside of the device, to implement a heat dissipation function for the chip 20. The heat dissipation apparatus 10 in FIG. 1 may dissipate heat for only one chip 20 or may dissipate heat for a plurality of chips 20 at the same time.

Optionally, when a heat dissipation apparatus 10 dissipates heat for a plurality of chips 20, to ensure effective heat dissipation for the plurality of chips 20, an area of an effective heat dissipation surface of the heat dissipation apparatus 10 may be greater than or equal to an area of a surface on which all to-be-heat-dissipated chips are in contact with the heat dissipation apparatus 10. For ease of description, in the following embodiments, an example in which a same heat dissipation apparatus 10 in FIG. 1 dissipates heat for only one chip 20 is used.

Figure 2:
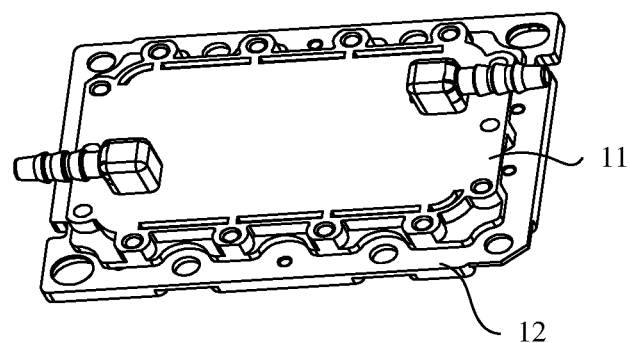
FIG. 2 is a schematic structural diagram of a heat dissipation apparatus.
Figure 3:
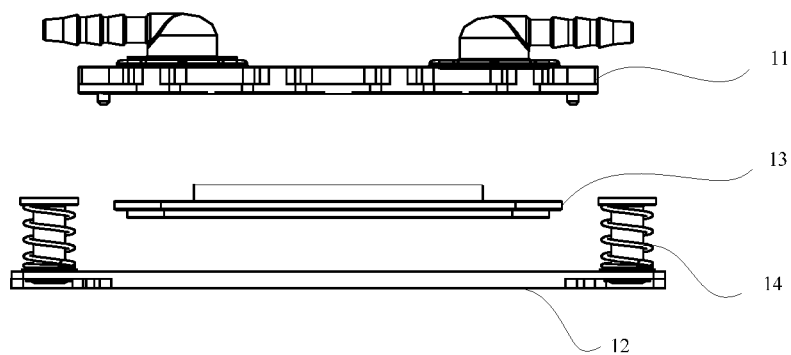
FIG. 3 is a schematic exploded diagram of a heat dissipation apparatus.

FIG. 2 is a schematic structural diagram of a heat dissipation apparatus 10. FIG. 3 is a schematic exploded diagram of a heat dissipation apparatus 10. As shown in FIG. 2 and FIG. 3, the heat dissipation apparatus 10 comprises a mounting base 12, a heat-conducting plate 13, and a pressing plate 11. The mounting base 12 is configured to be fastened to the mainboard 30 by using the connecting piece 40 in FIG. 1, the heat-conducting plate 13 is configured to conduct heat for the chip 20, and the pressing plate 11 is configured to fasten the heat-conducting plate 13 onto the mounting base 12.

During assembly, the mounting base 12, the heat-conducting plate 13, and the pressing plate 11 are disposed in a sandwich laminated manner, and the heat-conducting plate 13 is located between the mounting base 12 and the pressing plate 11. The pressing plate 11 is detachably connected to the mounting base 12. The pressing plate 11 and the mounting base 12 in FIG. 3 tightly press the heat-conducting plate 13 onto the mounting base 12 by using a threaded connecting piece 14 (for example, a bolt or a screw). The pressing plate 11 may be made of a metallic material, for example, aluminum, iron, steel, or an alloy, or may be made of plastic or a plastic material. A size of the pressing plate 11 adapts to the heat-conducting plate 13, and an area of the pressing plate 11 may be greater than or equal to an area of the heat-conducting plate 13, to ensure that the pressing plate 11 has a sufficient size to cover a surface of the heat-conducting plate 13.

Figure 4:
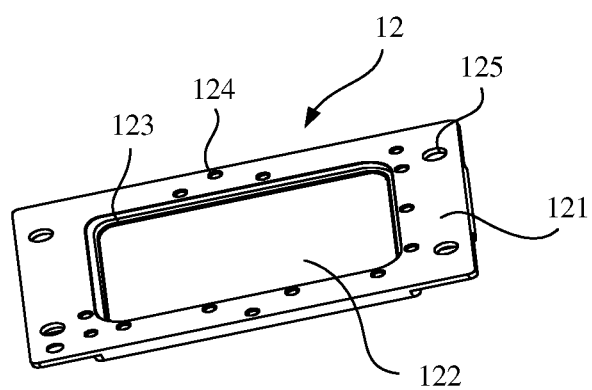
FIG. 4 is a schematic structural diagram of a first type of mounting base.
Figure 5:
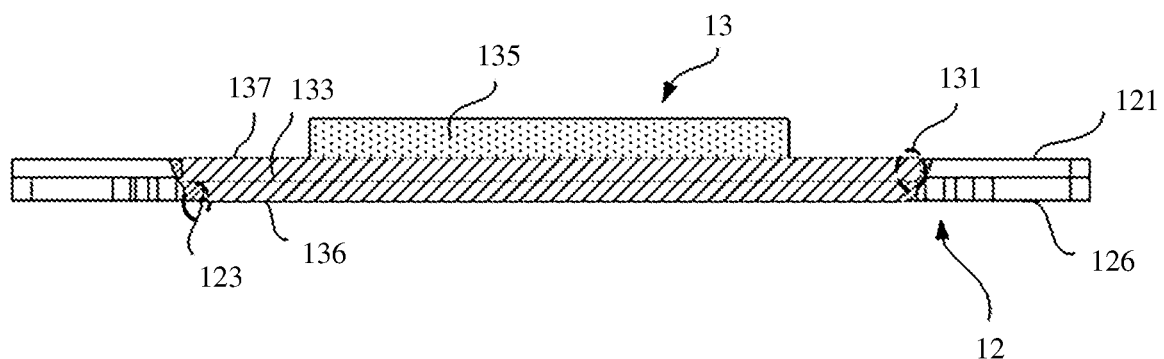
FIG. 5 is a schematic diagram of fitting between a first type of mounting base and a heat-conducting plate.

Referring to FIG. 4 and FIG. 5, FIG. 4 is a schematic structural diagram of a first type of mounting base 12, and FIG. 5 is a sectional view of a combination of a mounting base 12 and a heat-conducting plate 13. FIG. 5 is a sectional view of the mounting base 12 along a laminated direction of the pressing plate 11, the heat-conducting plate 13, and the mounting base 12 in FIG. 2. The mounting base 12 uses a hollow frame-shaped structure, and the frame-shaped structure has two opposite surfaces: a surface 121 and a surface 126. The surface 121 is configured to be attached to the heat-conducting plate 13, and the surface 126 is configured to be connected to the chip 20. For ease of description, the surface 121 may also be referred to as a first surface 121, and the surface 126 may be referred to as a second surface 126.

Referring to FIG. 4, the mounting base 12 is used as a connection structure of fitting between the heat dissipation apparatus 10 and the chip 20. A plurality of mounting holes 125 are disposed on an edge of the mounting base 12. When the heat dissipation apparatus 10 is fastened onto the chip 20, the heat dissipation apparatus 10 is connected to the mainboard 30 that bears the chip 20 by using the threaded connecting piece 14 (the bolt or the screw) through the mounting holes 125, and the connection structure is detachable. In the mounting base 12 in FIG. 4, there are four mounting holes 125 respectively located in frame-shaped corner areas. In addition, assembly holes 124 are further disposed on the mounting base 12. The assembly holes 124 are configured to enable the threaded connecting piece 14 (the bolt or the screw) to penetrate through the assembly holes 124, to fasten the pressing plate 11. The assembly holes 124 are disposed around a hollow part of the mounting base 12.

FIG. 4 shows only an arrangement of the mounting holes 125 and the assembly holes 124. During implementation, a quantity of the mounting holes 125 and a quantity of the assembly holes 124 do not constitute a limitation. Quantities and positions of the mounting holes 125 and the assembly holes 124 may be set on the mounting base 12 according to an actual mounting requirement.

Referring to FIG. 4, the hollow part of the mounting base 12 is an accommodation cavity 122 configured to place the heat-conducting plate 13, and the hollow part of the mounting base 12 refers to forming a hole in an area using a center point of the mounting base 12. A cross section of the area may be a rectangle, a square, a circle, or another shape, and may match a shape of the heat-conducting plate 13 that is placed in the accommodation cavity 122. The center point is a position of a center of the mounting base 12. For example, when the mounting base 12 uses a rectangular structure, the center point is an intersection point of diagonal lines. Referring to FIG. 5, when the heat-conducting plate 13 is assembled, apart of the heat-conducting plate 13 is inserted into the accommodation cavity 122 in FIG. 4.

As shown in FIG. 5, a structure of the heat-conducting plate 13 is also described. The heat-conducting plate 13 includes a substrate 133 and a heat dissipation structure 135 disposed on the substrate 133, and the substrate 133 is inserted into the accommodation cavity 122. During fitting, as shown in FIG. 5, a position-limiting protrusion 123 is disposed in the accommodation cavity 122, the position-limiting protrusion 123 is disposed around an inner wall of the accommodation cavity 122 for one circle, and a disposing position of the position-limiting protrusion 123 is close to the surface 126 of the mounting base 12. The substrate 133 of the heat-conducting plate 13 has a position-limiting protrusion 131 clamped with the position-limiting protrusion 123. The position-limiting protrusion 123 of the mounting base 12 may also be referred to as a first position-limiting protrusion 123, and the position-limiting protrusion 131 of the heat-conducting plate 13 may also be referred to as a second position-limiting protrusion 131. A volume of the accommodation cavity 122 may be greater than or equal to a volume of an insertion part of the heat-conducting plate 13, to ensure that the base 12 and the heat-conducting plate 13 can be smoothly combined.

When the heat-conducting plate 13 is inserted into the accommodation cavity 122, the position-limiting protrusion 131 is in contact with the position-limiting protrusion 123 and limits an insertion depth of the heat-conducting plate 13, so that a surface 136 of the heat-conducting plate 13 that is connected to the to-be-heat-dissipated chip is exposed to the surface 121 of the mounting base 12. The surface 136 of the heat-conducting plate 13 is an effective heat dissipation area of the heat dissipation apparatus 10 described in the foregoing content. For ease of description, the surface 136 may be referred to as a second surface 136, and an area of the second surface 136 is at least greater than or equal to a surface area of the to-be-heat-dissipated chip. After the heat-conducting plate 13 and the mounting base 12 are assembled, the surface 136 of the heat-conducting plate 13 and the surface 126 of the mounting base 12 may be located on a same horizontal plane, so that the heat-conducting plate 13 may be directly connected to the chip 20 by using a heat-conducting adhesive or another heat-conducting medium.

Optionally, the position-limiting protrusion 123 in FIG. 5 is merely an example. Alternatively, a structure in which a plurality of position-limiting protrusions 123 are disposed may be used, and the plurality of position-limiting protrusions 123 are spaced around a side wall of an accommodation groove, or another position-limiting structure may be used to limit an insertion depth of the heat-conducting plate 13.

Figure 6:
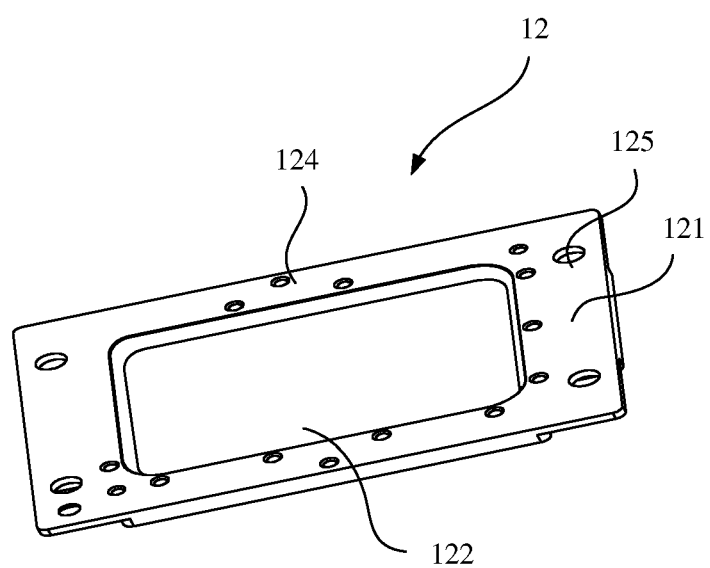
FIG. 6 is a schematic structural diagram of a second type of mounting base.

In a possible embodiment, FIG. 6 shows a structure of a second type of mounting base 12. For a part of the mounting base 12 in FIG. 6 that has a same reference sign as that in FIG. 4 or FIG. 5, refer to FIG. 4 or FIG. 5. As shown in FIG. 6, the mounting base 12 uses a frame structure. A difference between the mounting base 12 in FIG. 6 and the mounting base 12 in FIG. 4 lies in that the accommodation cavity 122 of the frame structure in FIG. 6 does not have the position-limiting protrusion 123, but a position-limiting structure is disposed on the heat-conducting plate 13.

Figure 7:
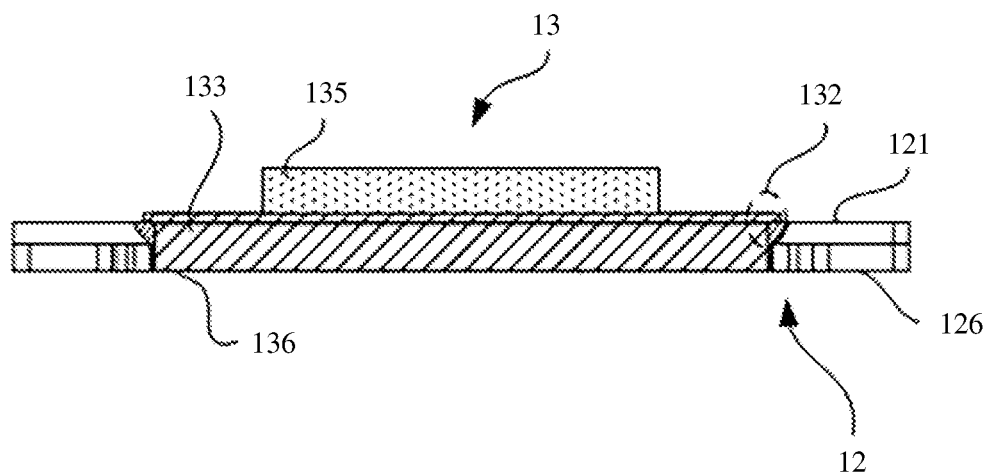
FIG. 7 is a schematic diagram of fitting between a second type of mounting base and a heat-conducting plate.

As shown in FIG. 7, FIG. 7 is a sectional view of fitting between the mounting base 12 and the heat-conducting plate 13. FIG. 7 is a sectional view of the mounting base 12 along a laminated direction of the pressing plate 11, the heat-conducting plate 13, and the mounting base 12 in FIG. 2. For a part that has a same reference sign as that in FIG. 5, refer to the description in FIG. 5. A position-limiting protrusion 132 is disposed on the heat-conducting plate 13, and the position-limiting protrusion 132 abuts against the surface 121 of the mounting base 12 to limit an insertion depth of the heat-conducting plate 13. For ease of description and distinguishing between the position-limiting protrusion 132 in FIG. 7 and the first position-limiting protrusion 123 and the second position-limiting protrusion 131, the position-limiting protrusion 132 may also be referred to as a third position-limiting protrusion. During assembly, the substrate 133 of the heat-conducting plate 13 is inserted into the accommodation cavity 122, and the heat-conducting plate 13 limits, by using the position-limiting protrusion 132, a depth at which the heat-conducting plate 13 is inserted into the mounting base 12.

After the assembly is completed, the surface 136 connected to the to-be-heat-dissipated chip in the heat-conducting plate 13 and the surface 126 of the mounting base 12 may be located on a same horizontal plane or close to a same horizontal plane, and the heat-conducting plate 13 may be directly connected to the chip 20 in a heat-conducting manner. Optionally, a sealing gasket may further be disposed at an edge of the accommodation cavity 122, to further seal and fasten the position-limiting protrusion 132 of the heat-conducting plate 13.

Figure 8:
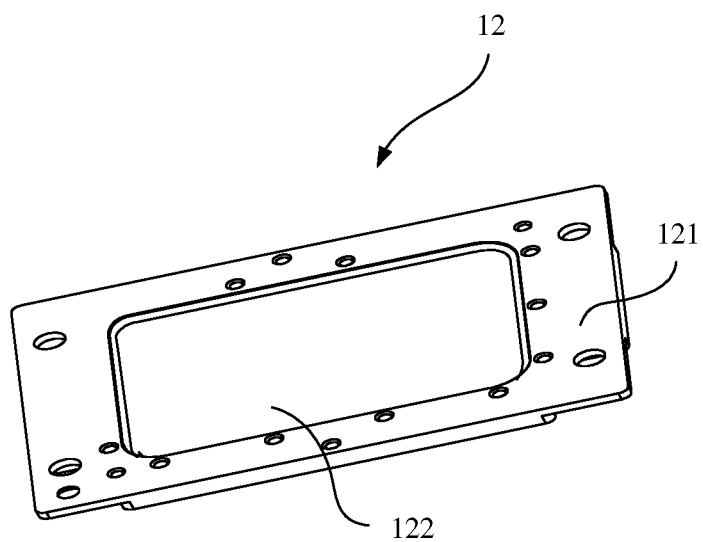
FIG. 8 is a schematic diagram of a third type of mounting base.
Figure 9:
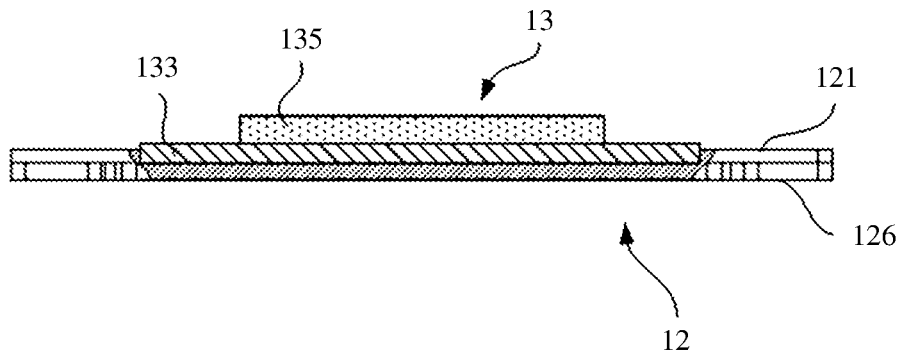
FIG. 9 is a sectional view of fitting between a third type of mounting base and a chip.

In another possible embodiment, FIG. 8 is a schematic structural diagram of a third type of mounting base 12, and FIG. 9 is a sectional view of fitting between a third type of mounting base 12 and a chip 20. FIG. 9 is a sectional view of the mounting base 12 along a laminated direction of the pressing plate 11, the heat-conducting plate 13, and the mounting base 12 in FIG. 2. For a part that has a same reference sign as that in FIG. 5, refer to the description in FIG. 5.

A difference between the third type of mounting base 12 and the first type and the second type of mounting base 12 lies in that, the accommodation cavity 122 of the first type and the second type of mounting base 12 uses the hollow frame-shaped structure, and the third type of mounting base 12 uses a groove structure. A thickness of a groove bottom of the third type of mounting base 12 may be a first value, and the first value may be set according to a requirement, to ensure that the heat-conducting plate 13 can conduct heat of the chip 20 by using the groove bottom. This can effectively dissipate heat for the chip 20.

The mounting base 12 may use a plate structure, and the mounting base 12 has a surface 121 and a surface 126 that are opposite to each other. The surface 121 is configured to be attached to the heat-conducting plate 13, and the surface 126 is configured to be connected to the chip 20. A groove is disposed on the surface 121, and a hollow part of the groove forms an accommodation cavity 122 that accommodates the heat-conducting plate 13. During assembly, the heat-conducting plate 13 is fastened in the groove, and when the heat-conducting plate 13 is inserted into the groove, the heat-conducting plate 13 is connected to a bottom wall of the groove. When the heat dissipation apparatus 10 is combined with the chip 20, heat generated by the chip 20 is transferred to the bottom wall of the mounting base 12, and then is conducted to the heat-conducting plate 13 by using the bottom wall of the mounting base 12.

It can be learned from FIG. 4, FIG. 6, and FIG. 8 that the mounting base 12 may be implemented in different structural forms provided that the mounting base 12 has the accommodation cavity 122 that accommodates the heat-conducting plate 13. A structure of the accommodation cavity 122 on the mounting base 12 and the fitting relationship between the mounting base 12 and the heat-conducting plate 13 may be set according to a service requirement.

The foregoing describes the structure of the mounting base 12 with reference to FIG. 2 to FIG. 9. The following further describes a structure of a heat-conducting plate 13 provided in the embodiments with reference to FIG. 10 to FIG. 21.

The heat-conducting plate 13 may be used as a main component of a heat dissipation apparatus 10 and has a first surface 136 and a second surface 137 that are opposite surfaces of substrate 133. A liquid channel is disposed on the first surface 136 of the heat-conducting plate 13, and the second surface 137 of the heat-conducting plate 13 is configured to connect to a chip 20. In the implementation shown in FIG. 5, the heat-conducting plate 13 includes the substrate 133 and the heat dissipation structure 135 firmly disposed on the substrate 133. The heat dissipation structure 135 may be different structures such as a liquid channel, a capillary structure, or a pipe. A thickness of the substrate 133 may be set according to an implementation requirement. To improve a heat-conducting effect, the substrate 133 may be thinned as much as possible.

Figure 10:
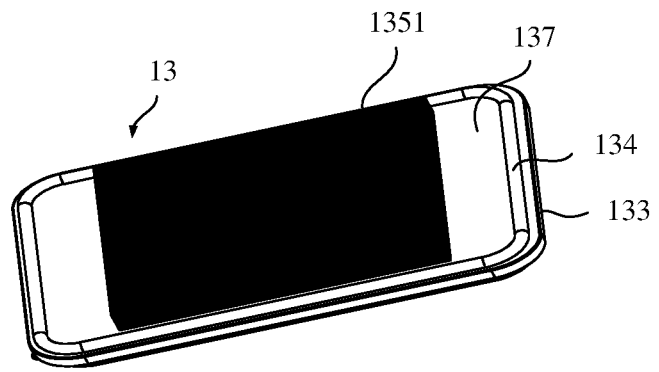
FIG. 10 is a schematic structural diagram of a first type of heat-conducting plate.

As shown in FIG. 10, FIG. 10 is a schematic structural diagram of a heat-conducting plate 13. As shown in the figure, the substrate 133 of the heat-conducting plate 13 may be completely or partially clamped in the accommodation cavity 122 of the mounting base 12. In addition, a shape and a structure of the partial heat-conducting plate 13 clamped in the accommodation cavity 122 match a shape and a structure of the accommodation cavity 122 of the mounting base 12. When the mounting base 12 is the mounting base 12 of different structural forms in FIG. 4, FIG. 6, or FIG. 8, the substrate 133 may adapt to the mounting base 12 by using a corresponding structure. For ease of description, that the mounting base 12 uses the structure in FIG. 4 is used as an example.

Referring to FIG. 5 and FIG. 10, FIG. 10 is a schematic structural diagram of a first type of heat-conducting plate 13. FIG. 5 is a sectional view of the first type of heat-conducting plate 13 along a laminated direction of the pressing plate 11, the heat-conducting plate 13, and the mounting base 12 in FIG. 2. First, referring to FIG. 10, the substrate 133 on the heat-conducting plate 13 uses a rectangular plate structure. Referring to FIG. 5, the substrate 133 has the surface 136 and the surface 137 that are opposite to each other. For ease of description, the surface 136 may also be referred to as a first surface 136 of the heat-conducting plate 13, and the surface 137 is a second surface 137 of the heat-conducting plate 13.

Still referring to FIG. 5, the position-limiting protrusion 131 is correspondingly disposed on a side wall of the substrate 133. When the substrate 133 is inserted into the accommodation cavity 122, the surface 136 of the substrate 133 is exposed outside the mounting base 12 as a contact surface 136 with the chip 20. The position-limiting protrusion 123 is in contact with the position-limiting protrusion 131 to limit a position at which the heat-conducting plate 13 is inserted into the mounting base 12. When the mounting base 12 is in another structure form, the substrate 133 of the heat-conducting plate 13 may be relatively disposed in a corresponding structure, so that the substrate 133 adapts to the accommodation cavity 122 of the mounting base 12.

Referring to FIG. 10, the heat dissipation structure 135 of the heat-conducting plate 13 may use a capillary structure 1351. The capillary structure 1351 has a plurality of connected holes inside, and the plurality of holes are used to form a liquid channel for liquid flowing. When the heat-conducting plate 13 fits with the mounting base 12, the capillary structure 1351 of the heat-conducting plate 13 is located on the surface 137 of the heat-conducting plate 13 and is located above the mounting base 12. The "above" refers to a reference direction of a placement direction of the heat-conducting plate 13 in FIG. 5.

Still referring to FIG. 10, the capillary structure 1351 in FIG. 10 uses a porous structure, for example, a porous structure formed by sintering a metal powder or a metal mesh. When the metal mesh is used to form the capillary structure 1351, the metal mesh is woven by using a metal wire, uses a porous structure, and is welded to the substrate 133 by using a single-layer or multi-layer mesh, to form a connected liquid channel (not shown in the figure). When the capillary structure 1351 made by sintering the metal powder is used, the metal powder is sintered into a spherical granular structure, a gap is formed between the spherical granular structures, and the gap is connected to form the liquid channel. However, regardless of whether the capillary structure 1351 is made by using the metal powder or the metal mesh, the metal powder or the metal mesh uses metal, an alloy with a good heat-conducting effect, or another material with a high heat-conducting property such as copper, aluminum, or iron.

Figure 11:
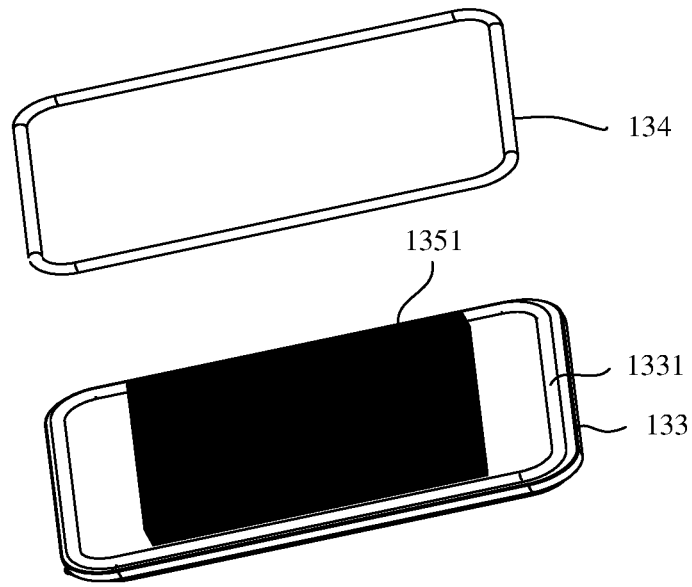
FIG. 11 is a schematic exploded diagram of a first type of heat-conducting plate.

When the heat-conducting plate 13 uses the foregoing structure, the pressing plate 11 may seal the liquid channel on the heat-conducting plate 13, to avoid liquid leakage. Referring to FIG. 10 and FIG. 11, FIG. 11 is a schematic exploded diagram of a heat-conducting plate 13. A placement groove 1331 is disposed on the substrate 133, and a sealing gasket 134 is disposed in the placement groove 1331.

When the placement groove 1331 is disposed, the placement groove 1331 surrounds the capillary structure 1351, and the sealing gasket 134 is disposed in the placement groove 1331. In addition, when the pressing plate 11 is in contact with the heat-conducting plate 13, the pressing plate 11 is sealed with the heat-conducting plate 13 by using the sealing gasket 134.

Figure 12:
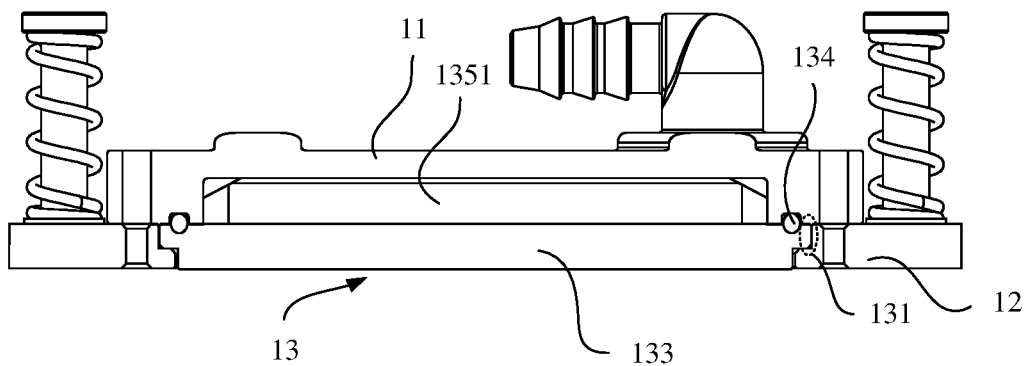
FIG. 12 is a sectional view of a heat dissipation apparatus.

FIG. 12 is a sectional view of a heat dissipation apparatus 10. FIG. 12 is a schematic diagram of along a laminated direction of the pressing plate 11, the heat-conducting plate 13, and the mounting base 12 in FIG. 2. As shown in the figure, when the pressing plate 11 covers the mounting base 12, the pressing plate 11 and the substrate 133 are sealed and connected by using the sealing gasket 134, and the capillary structure 1351 is sealed in a sealing cavity surrounded by the substrate 133 and the pressing plate 11. Optionally, a placement groove 1331 may also be disposed on the pressing plate 11, and the sealing gasket 134 is fastened in the placement groove 1331 of the pressing plate 11, so that the pressing plate 11 and the substrate 133 can be sealed and connected.

Figure 13:
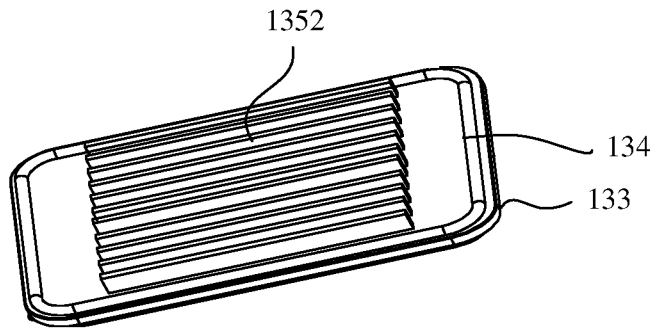
FIG. 13 is a schematic structural diagram of a second type of heat-conducting plate.

In a possible embodiment, FIG. 13 is a schematic diagram of a second type of heat-conducting plate 13. For a part that has a same reference sign as that in FIG. 4 or FIG. 5, refer to the description of the structure of the heat-conducting plate in FIG. 11. A difference between the heat-conducting plate 13 in FIG. 13 and the heat-conducting plate 13 in FIG. 11 lies in that liquid channels of the heat-conducting plate 13 are different. As shown in FIG. 13, a plurality of metal sheets 1352 are disposed on the substrate 133, and the plurality of metal sheets 1352 are spaced to form a connected liquid channel (not shown in the figure). When the heat-conducting plate 13 fits with the mounting base 12 and the pressing plate 11, reference may be made to the description of the example in FIG. 12. A protrusion may be disposed on the heat-conducting plate 13 and an S-shaped groove may be disposed in the protrusion as the liquid channel.

Figure 14:
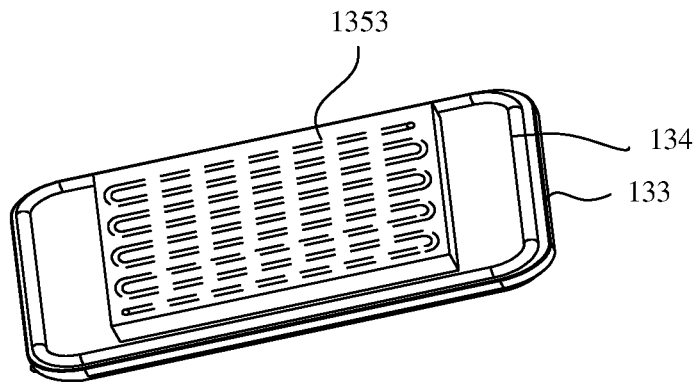
FIG. 14 is a schematic structural diagram of a third type of heat-conducting plate.

In another possible embodiment, FIG. 14 shows a third type of heat-conducting plate 13. For a part that has a same reference sign as that in FIG. 11, refer to the description of the structure of the heat-conducting plate in FIG. 11. A difference between the heat-conducting plate 13 in FIG. 14 and the heat-conducting plate 13 in FIG. 11 lies in that liquid channel structures of the heat-conducting plate 13 are different. As shown in FIG. 14, an S-shaped pipe 1353 is disposed on the substrate 133 of the heat-conducting plate 13, and the pipe 1353 forms a liquid channel. When the heat-conducting plate 13 fits with the mounting base 12 and the pressing plate 11, reference may be made to the description of the example in FIG. 12. It should be noted that structures of different liquid channels of the heat-conducting plate 13 may be combined and used according to a service requirement and various implementations of the mounting base 12.

Figure 15:
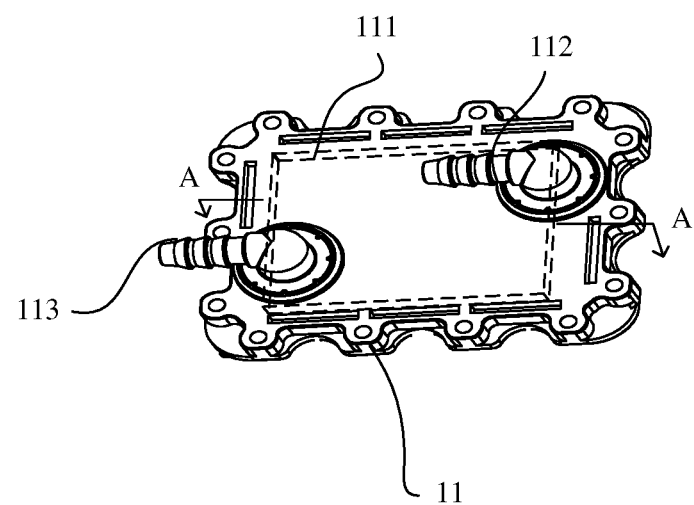
FIG. 15 is a schematic structural diagram of a pressing plate.
Figure 16:
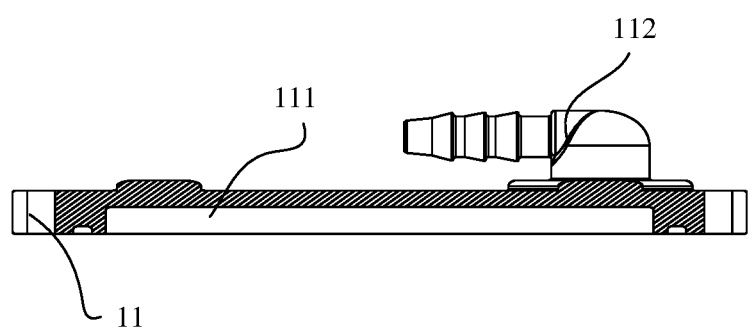
FIG. 16 is a sectional view of A-A in FIG. 15.

Referring to FIG. 12 and FIG. 15, FIG. 15 is a schematic structural diagram of the pressing plate 11. The pressing plate 11 is configured to be firmly connected to the mounting base 12. Referring to FIG. 15 and FIG. 16, FIG. 16 is a sectional view along A-A in FIG. 15. An accommodation groove 111 that accommodates a plurality of capillary structures is disposed on the pressing plate 11 (shown by a dashed-line box in FIG. 15, where the dashed-line box represents that the accommodation cavity 122 is an internal structure of the pressing plate 11). When the pressing plate 11 is firmly connected to the mounting base 12, as shown in FIG. 12, the substrate 133 of the heat-conducting plate 13 is located in the accommodation cavity 122, and the capillary structure 1351 of the heat-conducting plate 13 is located in the accommodation groove 111 of the pressing plate 11. In addition, a groove wall of the accommodation groove 111 and the substrate 133 are sealed by using the sealing gasket 134, so that a sealing cavity is formed between the pressing plate 11 and the heat-conducting plate 13, and the liquid channel (the capillary structure 1351) of the heat-conducting plate 13 is located in the sealing cavity. In addition, liquid is filled in the sealing cavity, so that the pressing plate 11 and the substrate 133 seal the capillary structure 1351, to ensure that the liquid filled in the liquid channel does not leak. The liquid may be common liquid such as water or oil.

Figure 17:
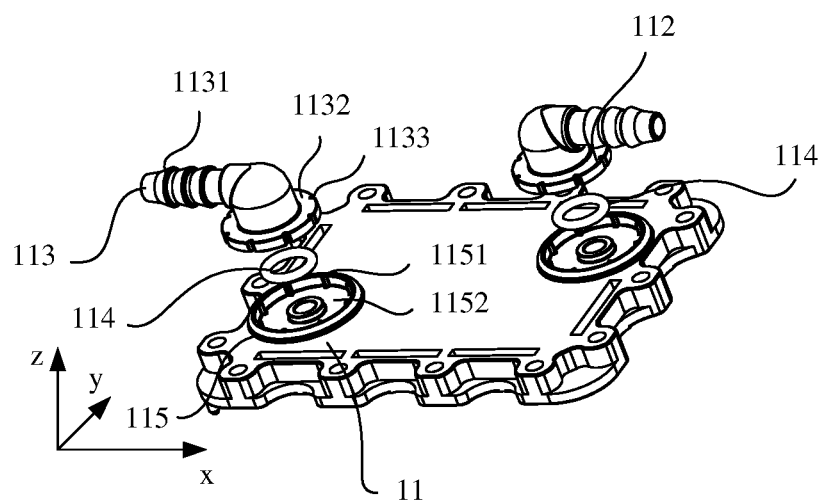
FIG. 17 is a schematic exploded diagram of a pressing plate.

Referring to FIG. 15 and FIG. 17, FIG. 17 is a schematic exploded diagram of the pressing plate 11 in FIG. 15. A liquid inlet connector 113 and a liquid outlet connector 112 that are connected to a liquid channel are disposed on the pressing plate 11, and the liquid inlet connector 113 and the liquid outlet connector 112 are separately configured to connect to an external pipe.

Referring to FIG. 17, for ease of description, a coordinate system xyz is established, where an x-axis direction and a y-axis direction are respectively parallel to two sides of the pressing plate 11, and a z-axis direction is perpendicular to the x-axis direction and the y-axis direction. As shown in FIG. 17, a connection manner between the liquid inlet connector 113 and the pressing plate 11 is the same as a connection manner between the liquid outlet connector 112 and the pressing plate 11. For brevity, the liquid inlet connector 113 is used as an example for description in the following. A boss 115 corresponding to the liquid inlet connector 113 is disposed on the pressing plate 11, the boss 115 has a mounting groove 1152, the boss 115 has a through hole (not marked in the figure) that connects to the accommodation groove of the pressing plate 11, and the through hole is connected to the mounting groove 1152. The liquid inlet connector 113 is an inverted L-shaped connector, and the liquid inlet connector 113 includes a horizontal part and a vertical part connected to the horizontal part.

As shown in FIG. 17, the horizontal part is parallel to the x-axis direction, and the vertical part is parallel to the z-axis direction. The horizontal part of the liquid inlet connector 113 includes a plurality of protrusion structures 1131 arranged in a length direction of the horizontal part. The protrusion structures 1131 are configured to clamp a liquid inlet pipe. When the liquid inlet pipe is connected to the liquid inlet connector 113, the liquid inlet pipe is tightly locked on the liquid inlet connector 113 by using the protrusion structures 1131. The vertical part of the liquid inlet connector 113 has a convex shoulder 1132. When the convex shoulder 1132 is assembled in the mounting groove 1152, the convex shoulder 1132 is directly inserted into the mounting groove 1152, and the liquid inlet connector 113 is connected to the accommodating groove 111 of the pressing plate 11 through the through hole in the mounting groove 1152. A sealing ring 114 is provided between the liquid inlet connector 113 and the pressing plate 11, and the liquid inlet connector 113 and the pressing plate 11 are sealed by using the sealing ring 114. When the liquid inlet connector 113 is connected to the pressing plate 11, a cavity in the liquid inlet connector 113 is connected to the accommodation groove 111 through the through hole, and after the pressing plate 11 and the substrate 133 are sealed to form the liquid channel, the liquid inlet connector 113 is connected to the liquid channel. After the liquid outlet connector 112 is connected to the pressing plate 11, the liquid outlet connector 112 is also connected to the liquid channel.

In FIG. 15, a shape of the pressing plate 11 matches a shape and a size of the mounting base 12. When the mounting base 12 is a rectangle, a corresponding shape of the pressing plate 11 is also a rectangle. When the mounting base 12 is in another shape, the pressing plate 11 is in a matched shape. Using FIG. 11 as an example, the liquid inlet connector 113 and the liquid outlet connector 112 are disposed in a diagonal manner, so that when the liquid inlet connector 113 and the liquid outlet connector 112 are connected to the liquid channel, the liquid inlet connector 113 and the liquid outlet connector 112 may respectively be connected to two ends of the liquid channel. This enables the liquid to flow a relatively long distance in the liquid channel, enlarges an area of a to-be-heat-dissipated apparatus component whose heat can be conducted by a using liquid medium, and further improves a heat dissipation effect of the liquid on the chip 20 during flowing.

Optionally, in addition to the manner in FIG. 15, the liquid inlet connector 113 and the liquid outlet connector 112 may alternatively be located on a same side of the pressing plate 11. A setting manner may be correspondingly set based on a liquid channel setting manner. If two ends of the liquid channel are located on a same side, the liquid inlet connector 113 and the liquid outlet connector 112 are also located on a same side. If two ends of the liquid channel are disposed in a diagonal manner, the liquid inlet connector 113 and the liquid outlet connector 112 are also disposed in a diagonal manner.

Referring to FIG. 17, the mounting groove 1152 may be cylindrical, and the corresponding convex shoulder 1132 may also be cylindrical, so that the convex shoulder 1132 rotates in the mounting groove 1152. Optionally, to limit rotation of the convex shoulder 1132 in the mounting groove 1152, a side wall of the mounting groove 1152 has a plurality of position-limiting protrusions 1151, and the convex shoulder 1132 has a position-limiting groove 1133 fitting with each position-limiting protrusion 1151. When the convex shoulder 1132 is inserted into the mounting groove 1152, the position-limiting protrusions 1151 and the position-limiting grooves 1133 are in a one-to-one correspondence for fitting, to limit rotation of the convex shoulder 1132. A quantity of the position-limiting protrusions 1151 may be set as required, for example four, eight, or ten.

Optionally, in FIG. 17, a side wall of the mounting groove 1152 may alternatively have a plurality of position-limiting grooves 1133, and the convex shoulder 1132 has a position-limiting protrusion 1151 fitting with each position-limiting groove 1133. Alternatively, the mounting groove 1152 may be in a shape of a polygonal prism, and a corresponding convex shoulder 1132 may also be in a shape of a matched polygonal prism. By using the structure, after angles of the liquid inlet connector 113 and the liquid outlet connector 112 are selected, the liquid inlet connector 113 and the liquid outlet connector 112 may be fastened by using the convex shoulder 1132 and the mounting groove 1152, averting a change in the angles of the liquid inlet connector 113 and the liquid outlet connector 112 caused by device oscillations or collisions.

Figure 18:
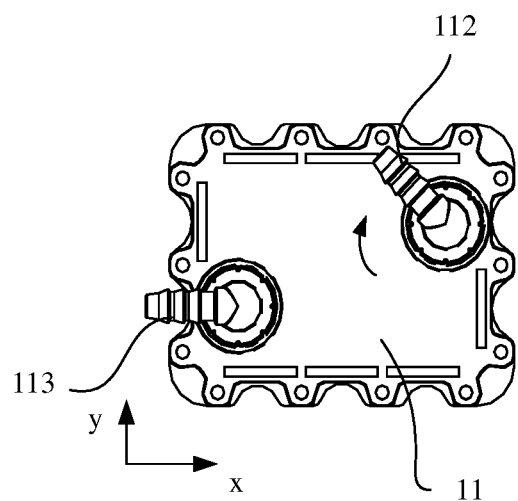
FIG. 18 to FIG. 21 are schematic diagrams of rotation of a liquid outlet connector.

When the structure in FIG. 17 is used, both the liquid inlet connector 113 and the liquid outlet connector 112 can implement rotation based on the pressing plate 11. In other words, both directions of the liquid inlet connector 113 and the liquid outlet connector 112 can be changed by using the position-limiting protrusion 1151 and the position-limiting groove 1133, that the liquid inlet connector 113 and the liquid outlet connector 112 after rotating can be firmly connected to the pressing plate 11. Referring to FIG. 18 to FIG. 21, FIG. 18 to FIG. 21 are schematic diagrams of rotating the liquid inlet connector 113 and the liquid outlet connector 112 to different states. First, referring to FIG. 18, for ease of description, an x-y coordinate system is established, where an x-axis direction is parallel to a long side edge of the pressing plate 11, and a y-axis direction is parallel to a short side edge of the pressing plate 11. The liquid inlet connector 113 is in a direction of the x-axis (a placement direction of the pressing plate 11 in FIG. 18 is used as a reference direction), and the liquid outlet connector 112 is in a direction obliquely upward and has an angle of 60° with the direction of the x-axis.

Figure 19:
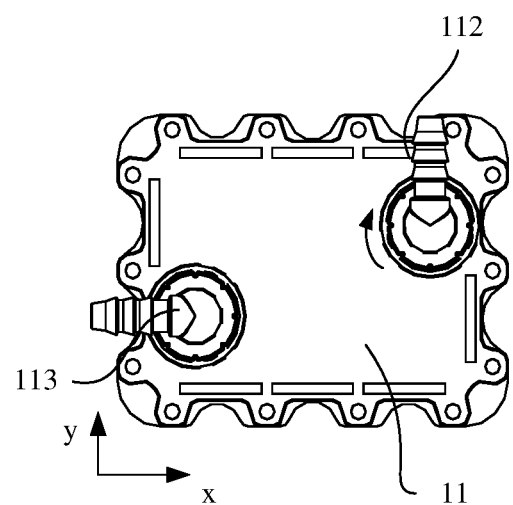

When the direction of the liquid outlet connector 112 needs to be adjusted, the convex shoulder 1132 of the liquid outlet connector 112 is first removed from the mounting groove 1152, then the liquid inlet connector 113 is rotated out in a direction indicated by an arrow in FIG. 18, the convex shoulder 1132 of the liquid inlet connector 113 is inserted into the mounting groove 1152 again, and the position-limiting groove 1133 on the convex shoulder 1132 fits with the position-limiting protrusion in the mounting groove 1152 to limit the liquid inlet connector 113 not to rotate. A direction of the liquid inlet connector 113 is shown in FIG. 19, and the liquid outlet connector 112 rotates to the direction of the y axis. When the liquid outlet connector 112 needs to be adjusted again in the direction indicated by the arrow in FIG. 19, the foregoing operations are repeated, and the liquid outlet connector 112 rotates to a state in FIG. 20. In this case, the liquid outlet connector 112 rotates to having an angle of 120° with the direction of the x axis.

Figure 20:
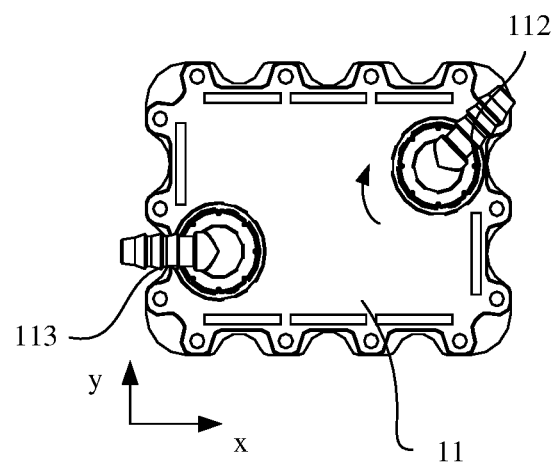
Figure 21:
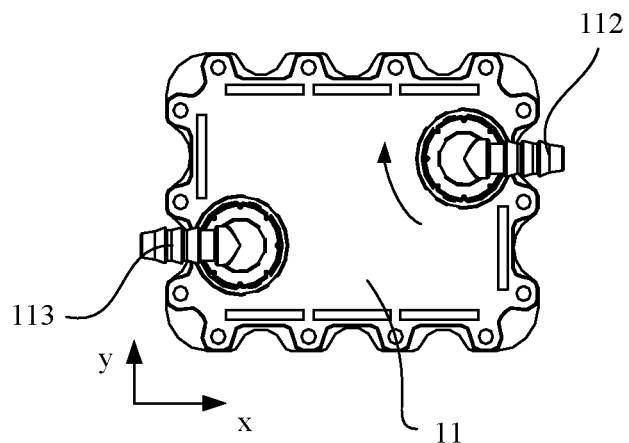

When the liquid outlet connector 112 needs to be adjusted again in the direction indicated by the arrow in FIG. 20, the foregoing operations are repeated, and the liquid outlet connector 112 rotates to a state in FIG. 21. In this case, the liquid outlet connector 112 rotates to the direction of the x-axis, and the direction of the liquid outlet connector 112 is opposite to the direction of the liquid inlet connector 113. It can be learned from the processes in FIG. 18 to FIG. 21 that the liquid outlet connector 112 may rotate to different angles as required. When the liquid outlet connector 112 is connected to a liquid outlet pipe of a cooling system, a position of the liquid outlet connector 112 may be adjusted based on a setting position of the liquid outlet pipe, to facilitate the liquid outlet connector 112 to be connected to the cooling system. For a rotation manner of the liquid inlet connector 113, refer to rotation of the liquid outlet connector 112. Details are not described herein again.

Figure 22A:
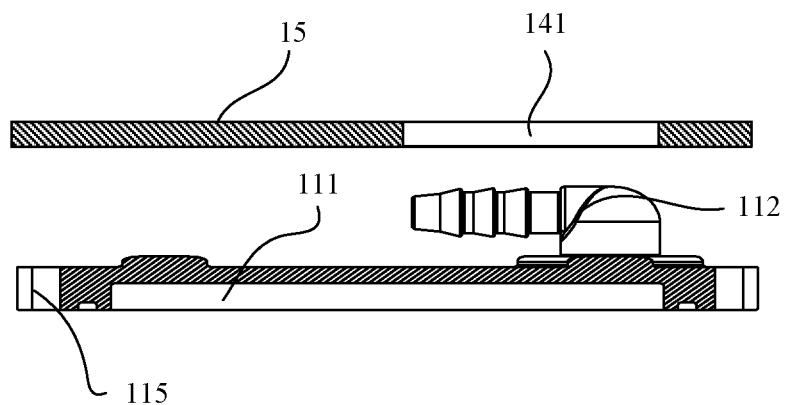
FIG. 22A is a schematic diagram of fitting between a pressing plate and a pressing cover.
Figure 22B:
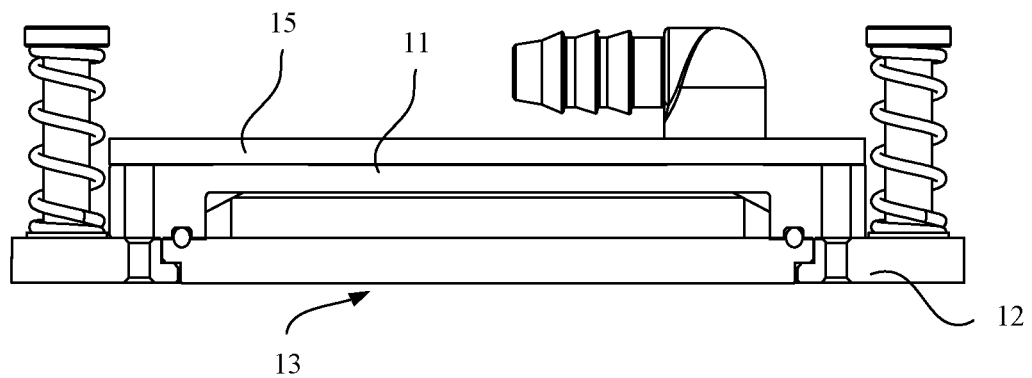
FIG. 22B is a schematic diagram of fitting between a pressing plate and a pressing cover.

In a possible embodiment, based on the structures in FIG. 18 to FIG. 21, the heat dissipation apparatus 10 may further be fastened by using a pressing cover. FIG. 22A-B is a schematic structural diagram of a pressing plate 11 and a pressing cover. In FIG. 22A-B, for a part that has a same reference sign as that in FIG. 17, refer to the description of the structure of the pressing plate 11 in FIG. 17. As shown in the figure, when the liquid inlet connector 113 and the liquid outlet connector 112 are connected to the pressing plate 11 in the foregoing manner, the liquid inlet connector 113 and the liquid outlet connector 112 are fastened to the pressing plate 11 by using the pressing cover. The pressing cover is stacked on a side that is of the pressing plate 11 and that is away from the accommodation groove 111, and a through hole 141 fitting with the liquid inlet connector 113 and the liquid outlet connector 112 is disposed on the pressing cover. The pressing cover is configured to be firmly connected to the mounting base 12, where the fastened connection may be detachable, and the pressing cover is tightly pressed onto the heat-conducting plate 13. For example, the pressing cover 14 is connected to the mounting base 12 by using a threaded connecting piece 14 (a bolt or a screw), and the pressing plate 11 is tightly pressed onto the mounting base 12. In addition, the pressing cover also tightly presses the liquid outlet connector and the liquid inlet connector onto the pressing plate 11.

During connection, the threaded connecting piece 14 sequentially passes through the pressing cover, the pressing plate 11, and the mounting base 12, and fastens the pressing cover and the pressing plate 11 onto the mounting base 12. When angles of the liquid inlet connector and the liquid outlet connector are adjusted, the pressing cover may be first removed, and then the liquid inlet connector or the liquid outlet connector each are rotated to an angle as required. Then, the pressing cover is firmly connected to the mounting base 12, and tightly presses the liquid inlet connector and the liquid outlet connector onto the pressing plate 11.

Optionally, the pressing cover may be made of a material with relatively high stiffness, for example, stainless steel, iron, or aluminum alloy, and the pressing plate 11 may be made of plastic or another material with relatively low stiffness. The pressing cover enhances pressure strength of the entire pressing plate 11 on the heat-conducting plate 13 and the mounting base 12. In a process of liquid flowing in the heat-conducting plate 13, the pressing plate 11 and the pressing cover may be used to jointly fasten the heat-conducting plate 13. In addition, when the device falls down or the device is placed upside down, the pressing cover may assist the pressing plate 11 in fastening the heat-conducting plate 13 and the mounting base 12. Liquid flowing out of the heat dissipation apparatus 10 may affect a heat dissipation effect of the heat dissipation apparatus 10.

FIG. 17 and FIG. 22A-B are merely examples of the pressing plate 11. In an implementation, the liquid inlet connector 113 may alternatively be rotatably connected to the pressing plate 11, and the liquid outlet connector 112 may be rotatably connected to the pressing plate 11. For example, the liquid inlet connector 113 and/or the liquid outlet connector 112 are/is rotatably connected to the pressing plate 11. Any one of the following manners may be included:

Manner 1: The liquid inlet connector 113 and the pressing plate 11 may be firmly connected, and the liquid outlet connector 112 and the pressing plate 11 are rotatably connected.

Manner 2: The liquid inlet connector 113 is rotatably connected to the pressing plate 11, and the liquid outlet connector 112 is firmly connected to the pressing plate 11.

Manner 3: The liquid inlet connector 113 is rotatably connected to the pressing plate 11, and the liquid outlet connector 112 is also rotatably connected to the pressing plate 11.

Optionally, the liquid inlet connector 113 and the liquid outlet connector 112 may alternatively be directly and rotatably connected to the pressing plate 11 in a clamping manner. In this case, a reliable connection between the liquid inlet connector 113, the liquid outlet connector 112, and the pressing plate 11 can also be ensured without using the pressing cover. However, when this structure is used, the pressing plate 11 may have a particular strength. When the pressing plate 11 is firmly connected to the mounting base 12, the pressing plate 11 need to have sufficient stiffness to ensure a sealing effect between the pressing plate 11 and the substrate 133.

When the pressing plate 11 is connected to the mounting base 12, the pressing plate 11 is connected to the mounting base 12 by using a threaded connecting piece 14 (for example, a bolt or a screw), for example, a bolt or a screw. In addition, the threaded connecting piece 14 is sleeved with a waterproof sealing ring. When the pressing plate 11 and the mounting base 12 are connected by using the threaded connecting piece 14, the waterproof sealing ring seals a gap between the threaded connecting piece 14 and the pressing plate 11. This improves a sealing effect.

In addition, the liquid inlet connector 113 and the liquid outlet connector 112 each may further be firmly connected to the pressing plate 11. In this case, neither the liquid inlet connector 113 nor the liquid outlet connector 112 can rotate relative to the pressing plate 11. During manufacturing, the liquid inlet connector 113, the liquid outlet connector 112, and the pressing plate 11 may be made and formed by using an integrally formed manufacturing process. This ensures sealing between the liquid inlet connector 113, the liquid outlet connector 112, and the pressing plate 11.

Figure 23:
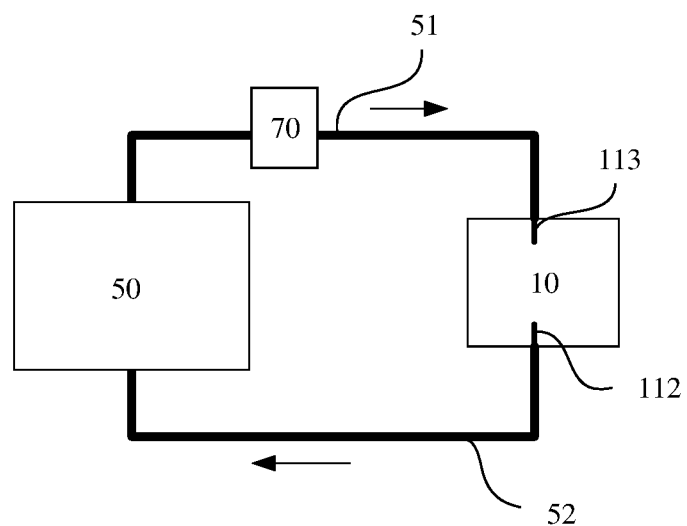
FIG. 23 is a schematic application diagram of a heat dissipation apparatus.

The liquid heat dissipation apparatus may be applied to a device, and a connection manner between the heat dissipation apparatus 10 and a cooling system that are in the device is shown in FIG. 23. The cooling system includes a power apparatus 70 configured to enable liquid to flow in a liquid channel, and a cooling apparatus 50 configured to cool liquid. As shown in FIG. 23, a liquid inlet of the cooling apparatus 50 is connected to a liquid inlet pipe 51, the liquid inlet pipe 51 is sealed with and connected to the liquid inlet connector 113, a liquid outlet pipe 52 is sealed with and connected to the liquid outlet connector 112, and the liquid outlet pipe 52 is connected to the liquid inlet of the cooling apparatus 50. This forms a liquid circulation loop. In a heat dissipation process, the liquid flows clockwise in the circulation loop, as shown by an arrow in FIG. 23. In addition, in a flowing process, cold liquid in the cooling apparatus 50 enters the liquid inlet pipe 51 by being driven by the power apparatus 70 and enters a sealing cavity of the heat dissipation apparatus 10 by flowing through the liquid inlet connector 113. Heat generated by a chip 20 is transferred to the liquid by using the heat-conducting plate 13, a temperature of the liquid increases after absorbing the heat, and the high-temperature liquid flows back to the cooling apparatus 50 through the liquid outlet connector 112 and the liquid outlet pipe 52 for cooling. The cooled liquid flows into the heat dissipation apparatus 10 again through the liquid inlet pipe 51 and the liquid inlet connector 113, to cyclically dissipate heat for the chip 20. The power apparatus 70 may be a plunger pump or another pump, and the cooling apparatus may be a condenser or another apparatus that can provide cooling. In addition, in FIG. 23, the power apparatus 70 is disposed on the liquid inlet pipe 51. However, it should be understood that the power apparatus 70 in FIG. 23 is merely an example, and the power apparatus 70 may also be disposed on the liquid outlet pipe 52.

FIG. 23 shows only an example of a manner in which the cooling system is connected to one heat dissipation apparatus 10. In another possible implementation, a plurality of heat dissipation apparatuses 10 may be disposed in parallel or in series. When the heat dissipation apparatuses 10 are disposed in parallel, liquid flowing out of the cooling apparatus 50 flows into the plurality of heat dissipation apparatuses 10 at the same time. When the heat dissipation apparatuses 10 are disposed in series, liquid flowing out of the cooling apparatus 50 sequentially flows through the plurality of heat dissipation apparatuses 10.

It can be learned from the foregoing description that the heat dissipation apparatus 10 provided in this embodiment is disposed in a sandwich laminated manner. In addition, the mounting base 12 and the pressing plate 11 may be made into standard parts. For chips having different heat dissipation requirements, only a heat-conducting plate 13 needs to be replaced. For example, a same type of device has a first chip or a second chip, where the first chip and the second chip have different heat dissipation requirements. During assembly, a mounting base 12 may be fastened onto the first chip or the second chip, and a cavity in the middle of the mounting base 12 faces the first chip or the second chip. A heat-conducting plate 13 corresponding to the first chip or the second chip is selected according to a heat dissipation requirement, and then a unified pressing plate 11 is assembled on a corresponding mounting base 12.

During the foregoing assembly, optionally, a first surface 136 of the heat-conducting plate 13 is at least not less than a surface area of a second surface of the chip 20, where the first surface 136 is a surface that is of the heat-conducting plate 13 and that is used to be in contact with the chip 20 in a heat-conducting manner, and the second surface is a surface that is of the chip 20 and that is used to connect to the heat-conducting plate 13 in a heat-conducting manner. In other words, during use, an area of the accommodation cavity 122 should be at least not less than the second surface of the chip 20. Therefore, an area of the disposed mounting base 12 should be greater than an area of a corresponding chip 20. It can be learned from the foregoing description that, for chips having different heat dissipation requirements, the only difference between heat dissipation apparatuses 10 corresponding to the chips is that the heat-conducting plates 13 between the mounting base 12 and the pressing plate 11 are different.

Therefore, the heat dissipation apparatus 10 provided in this embodiment may be applied to the chips having different heat dissipation requirements, provided that a corresponding heat-conducting plate 13 is used according to a heat dissipation requirement, and an entire heat dissipation apparatus 10 does not need to be replaced. Compared with an integral liquid heat dissipation apparatus, the heat dissipation apparatus 10 eliminates the need to select different liquid heat dissipation apparatuses for different chips and improves adaptability. In addition, during maintenance of the heat dissipation apparatus 10, only the heat-conducting plate 13 needs to be replaced, and the mounting base 12 and the pressing plate 11 may continue to be used. This reduces maintenance costs.

In addition, according to a modularized standard, only different molds need to be selected for the heat-conducting plate 13 according to a corresponding requirement of the chip 20, and the mounting base 12 and the pressing plate 11 may be made by using a unified mold. This reduces production difficulty of the heat dissipation apparatus 10 and reduces manufacturing costs of the heat dissipation apparatus 10. In addition, the liquid inlet connector and the liquid outlet connector that are connected to the pressing plate 11 may also be made into standard parts to facilitate pipe connection of the cooling system.

The embodiments provide a device. As shown in FIG. 1, the device may be a server, a memory, a router, a switch, or the like. As shown in FIG. 1, a chip 20 is configured to a mainboard 30 of the device, and a heat dissipation apparatus 10 is detachably and firmly connected to the mainboard 30 that bears the chip 20. When a heat dissipation apparatus 10 is used, reference may be made to FIG. 23. When the heat dissipation apparatus 10 is used, the device has a cooling apparatus 50, a liquid inlet pipe 51 in the cooling apparatus 50 is connected to a liquid inlet connector 113, and a liquid outlet pipe 52 is connected to a liquid outlet connector 112, to form a circulation loop. During use, liquid flows clockwise in the circulation loop, as shown by an arrow in FIG. 23. In addition, in a flowing process, cold liquid in the cooling apparatus 50 enters a sealing cavity of the heat dissipation apparatus 10 through the liquid inlet pipe 51 and the liquid inlet connector 113. Heat generated by a chip 20 is transferred to the liquid by using a heat-conducting plate 13, a temperature of the liquid increases after absorbing the heat, and the high-temperature liquid flows back to the cooling apparatus 50 through the liquid outlet connector 112 and the liquid outlet pipe 52 for cooling. The cooled liquid flows into the heat dissipation apparatus 10 again through the liquid inlet pipe 51 and the liquid inlet connector 113, to cyclically dissipate heat for the chip 20.

Figure 24:
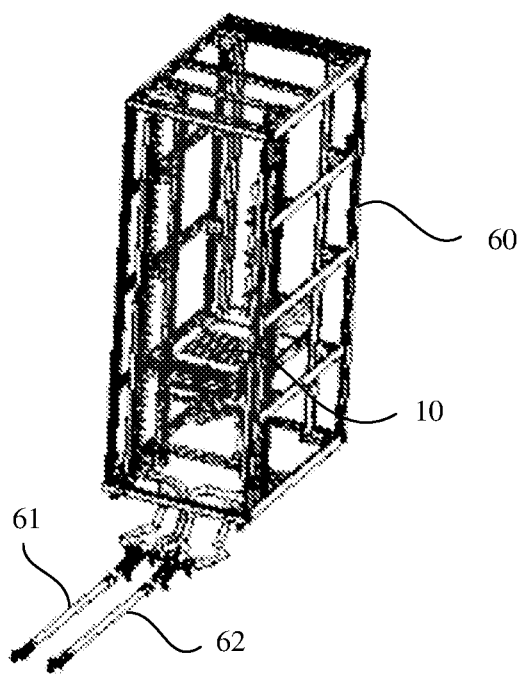
FIG. 24 is a schematic diagram of a rack.
Figure 25:
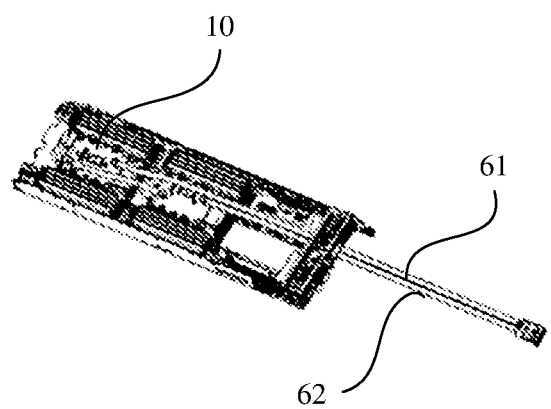
FIG. 25 is a schematic diagram of connection between a heat dissipation apparatus and a cooling system.

A possible embodiment further provides a rack. As shown in FIG. 24 and FIG. 25, FIG. 24 is a schematic diagram of the rack.

FIG. 25 is a schematic diagram of connection between a heat dissipation apparatus 10 and a cooling system. During use, a device is assembled on the rack 60, and the rack 60 may include a plurality of devices or may include only one device. The device may be a server, a storage device, a router, or a switch. The storage device includes a data storage device such as a storage array or a backup device. A cooling system (not shown in the figure) is disposed on the rack 60, and the cooling system is connected to a liquid inlet pipe 61 and a liquid outlet pipe 62. The liquid inlet pipe 61 is connected to a liquid inlet connector of a heat dissipation apparatus 10, and the liquid outlet pipe 62 is connected to a liquid outlet connector of the heat dissipation apparatus 10.

Optionally, the cooling system further includes a power apparatus (for example, a pump) for implementing liquid flowing in a liquid channel and a cooling apparatus configured to cool the liquid, so that the cooling system and the heat dissipation apparatus 10 form a circulation loop, and the liquid flows clockwise or counterclockwise. In addition, in a flowing process, cold liquid in the cooling apparatus enters a sealing cavity of the heat dissipation apparatus 10 through the liquid inlet pipe 61 and the liquid inlet connector. Heat generated by a chip 20 is transferred to the liquid by using the heat-conducting plate 13, a temperature of the liquid increases after absorbing the heat, and the high-temperature liquid flows back to the cooling apparatus through the liquid outlet connector and the liquid outlet pipe 62 for cooling. The cooled liquid flows into the heat dissipation apparatus 10 again through the liquid inlet pipe 61 and the liquid inlet connector 113, to cyclically dissipate heat for the chip 20.

The embodiments further provide a heat dissipation system. A structure of the heat dissipation system is similar to the structure in FIG. 23 or FIG. 24 and includes a heat dissipation apparatus 10 and a cooling system. The heat dissipation apparatus 10 is of the structure in FIG. 1. The cooling system includes a power apparatus configured to enable liquid to flow in a liquid channel and a cooling apparatus configured to cool liquid, so that the cooling system and the heat dissipation apparatus 10 form a circulation loop. The liquid flows clockwise or counterclockwise, heat of a to-be-heat-dissipated chip is conducted to the cooling apparatus by flowing of the liquid in the liquid channel, and the cooling apparatus cools the liquid. This implements heat dissipation for the to-be-heat-dissipated chip.

"First" in the first surface and the first position-limiting protrusion may be merely used as a name identifier and does not represent the first in sequence. The rule is also applicable to "second", "third", and the like.

The term "and/or" may be used to describe an association relationship between associated objects and indicates that three relationships may exist. For example, A and/or B may represent the following cases: Only A exists, both A and B exist, and only B exists. In addition, the character "/" in this specification generally indicates an "or" relationship between the associated objects.

Unless otherwise explicitly specified and limited, a term "connection" should be understood in a broad sense. For example, the "connection" may be a fastened connection, a detachable connection, or an integrated connection; and may be a direct connection or an indirect connection by using an intermediate medium.

The foregoing descriptions are merely implementations, but are not intended to limit the protection scope. Any variation or replacement readily figured out by a person skilled in the art within the scope shall fall within the protection scope. Therefore, the protection scope shall be subject to the protection scope of the claims.

What is claimed is:

1. A heat dissipation apparatus, comprising:
   a heat-conducting plate, wherein the heat-conducting plate comprises a first surface and a second surface that are opposite to each other, and a liquid channel is disposed on the first surface;
   a mounting base, wherein an accommodation cavity configured to accommodate a partial area that is in the heat-conducting plate and that comprises the second surface is disposed on the mounting base;
   a pressing plate, configured to fasten the heat-conducting plate in the accommodation cavity, wherein the pressing plate is detachably and firmly connected to the mounting base, a sealing cavity is formed between the pressing plate and the first surface of the heat-conducting plate, the sealing cavity is configured to accommodate the liquid channel, and a liquid inlet connector and a liquid outlet connector that are connected to the liquid channel are disposed on the pressing plate; and
   a pressing cover, wherein the pressing cover is detachably and firmly connected to the mounting base, and the pressing cover is pressed onto the heat-conducting plate.

2. The heat dissipation apparatus based on claim 1, wherein the heat-conducting plate further comprises:
   a substrate configured to be clamped into the accommodation cavity; and
   a heat dissipation structure firmly disposed on the substrate, wherein the heat dissipation structure is the liquid channel.

3. The heat dissipation apparatus based on claim 2, wherein a first position-limiting protrusion is disposed in the accommodation cavity of the mounting base, and a second position-limiting protrusion clamped with the first position-limiting protrusion is disposed on the substrate.

4. The heat dissipation apparatus based on claim 2, wherein a position-limiting protrusion is disposed on the substrate, and the position-limiting protrusion abuts against a surface of the mounting base.

5. The heat dissipation apparatus based on claim 1, wherein the pressing plate is sealed with and connected to the substrate by using a sealing gasket.

6. The heat dissipation apparatus based on claim 1, wherein at least one of the liquid inlet connector and the liquid outlet connector is rotationally connected to the pressing plate.

7. The heat dissipation apparatus based on claim 1, wherein an accommodation groove that accommodates the heat dissipation structure is disposed on the pressing plate.

8. The heat dissipation apparatus based on claim 1, wherein the pressing cover tightly presses the liquid outlet connector and the liquid inlet connector onto the pressing plate.

9. The heat dissipation apparatus based on claim 8, wherein bosses that are in a one-to-one correspondence with the liquid inlet connector and the liquid outlet connector are disposed on the pressing plate, each boss has a mounting groove, the liquid inlet connector or the liquid outlet connector has a convex shoulder assembled in the mounting groove, and the pressing cover tightly presses the convex shoulder into the mounting groove.

10. The heat dissipation apparatus based on claim 9, wherein, when the pressing cover does not tightly press the convex shoulder into the mounting groove, the convex shoulder is configured to rotate relative to the mounting groove.

11. The heat dissipation apparatus based on claim 10, wherein a side wall of the mounting groove has a plurality of position-limiting protrusions, and the convex shoulder has a position-limiting groove fitting with each position-limiting protrusion; or the side wall of the mounting groove has a plurality of position-limiting grooves, and the convex shoulder has a position-limiting protrusion fitting with each position-limiting groove.

12. The heat dissipation apparatus based on claim 1, wherein the pressing plate is a rectangle, and the liquid inlet connector and the liquid outlet connector are disposed in a diagonal manner.

13. The heat dissipation apparatus based on claim 1, wherein a floating screw configured to connect to a chip is disposed on the mounting base.

14. The heat dissipation apparatus based on claim 1, wherein an area of the second surface of the heat-conducting plate is greater than or equal to a surface area of a to-be-heat-dissipated chip, and the second surface is a surface of the heat-conducting plate that is used to conduct heat for the chip.

15. The heat dissipation apparatus based on claim 1, wherein the sealing cavity is filled with liquid that flows in the liquid channel.

16. The heat dissipation apparatus based on claim 1, wherein the heat dissipation apparatus is connected to a cooling system, cold liquid in the cooling system enters the sealing cavity of the heat dissipation apparatus, heat generated by the chip is transferred to the liquid by using the heat-conducting plate, the liquid absorbs the heat, and then flows back to the cooling system for cooling.

17. The heat dissipation apparatus based on claim 6claim 1, wherein a stiffness of the pressing cover is greater than a stiffness of the pressing plate.

18. A device, wherein the device comprises:
   a mainboard;
   a chip mounted on the mainboard; and
   a heat dissipation apparatus comprising:
      a heat-conducting plate, wherein the heat-conducting plate comprises a first surface and a second surface that are opposite to each other, and a liquid channel is disposed on the first surface;
      a mounting base, wherein an accommodation cavity configured to accommodate a partial area that is in the heat-conducting plate and that comprises the second surface is disposed on the mounting base; and
      a pressing plate, configured to fasten the heat-conducting plate in the accommodation cavity, wherein the pressing plate is detachably and firmly connected to the mounting base, a sealing cavity is formed between the pressing plate and the first surface of the heat-conducting plate, the sealing cavity is configured to accommodate the liquid channel, and a liquid inlet connector and a liquid outlet connector that are connected to the liquid channel are disposed on the pressing plate, wherein the heat dissipation apparatus is firmly connected to the mainboard and configured to dissipate heat for the chip.

19. The device based on claim 18, wherein the device is connected to a cooling system, the cooling system comprises a liquid inlet pipe and a liquid outlet pipe, the liquid inlet pipe is sealed with and connected to a liquid inlet connector of the heat dissipation apparatus, the liquid outlet pipe is sealed with and connected to a liquid outlet connector of the heat dissipation apparatus, and the cooling system further comprises:

a power apparatus configured to enable liquid to flow in a liquid channel; and a cooling apparatus configured to cool the liquid.

* * * * *